(12) United States Patent
Leem et al.

(10) Patent No.: US 11,158,827 B2
(45) Date of Patent: Oct. 26, 2021

(54) ORGANIC PHOTOELECTRIC DEVICES AND IMAGE SENSORS INCLUDING THE SAME

(71) Applicant: Samsung Electronics Co., Ltd., Suwon-si (KR)

(72) Inventors: Dong-Seok Leem, Hwaseong-si (KR); Gae Hwang Lee, Seongnam-si (KR); Sung Young Yun, Suwon-si (KR); Kwang Hee Lee, Hwaseong-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/422,233

(22) Filed: May 24, 2019

(65) Prior Publication Data
US 2019/0363269 A1    Nov. 28, 2019

(30) Foreign Application Priority Data
May 28, 2018    (KR) .................. 10-2018-0060395

(51) Int. Cl.
*H01L 51/42* (2006.01)
*H01L 27/30* (2006.01)
*H01L 51/00* (2006.01)

(52) U.S. Cl.
CPC .......... *H01L 51/424* (2013.01); *H01L 27/307* (2013.01); *H01L 51/006* (2013.01); *H01L 51/0061* (2013.01)

(58) Field of Classification Search
None
See application file for complete search history.

(56) References Cited

U.S. PATENT DOCUMENTS

| | | | |
|---|---|---|---|
| 8,546,898 B2 | 10/2013 | Thylen et al. | |
| 8,987,651 B2 | 3/2015 | Kurokawa | |
| 8,994,009 B2 | 3/2015 | Asami et al. | |
| 9,035,309 B2 | 5/2015 | Park et al. | |

(Continued)

FOREIGN PATENT DOCUMENTS

| | | |
|---|---|---|
| CN | 106572290 A | 4/2017 |
| JP | 3684149 B2 | 8/2005 |

(Continued)

OTHER PUBLICATIONS

Wu, S.H., "Simple near-infrared photodetector based on charge transfer complexes formed in molybdenum oxide doped N,N'-di(naphthalene-1-yl)-N,N'-diphenyl-benzidine", Phys. Status Solidi RR 6, No. 3, 129-131 (2012)/DOI 10.1002/pssr.201105596, 2012 Wiley-VCH Verlag GmbH & Co. KGaA, Weinheim, www.pss-rapid.com.

(Continued)

*Primary Examiner* — Khaja Ahmad
(74) *Attorney, Agent, or Firm* — Harness, Dickey & Pierce, P.L.C.

(57) ABSTRACT

An IR organic photoelectric device having a simplified device structure may include an anode and a cathode facing each other and an infrared absorption and hole transport composite monolayer between the anode and the cathode. An organic image sensor including the IR organic photoelectric device may include an absorption layer between the infrared absorption and hole transport composite monolayer and the cathode.

18 Claims, 19 Drawing Sheets

(56) References Cited

U.S. PATENT DOCUMENTS

| | | |
|---|---|---|
| 9,490,442 B2 | 11/2016 | Leem et al. |
| 9,787,953 B2 | 10/2017 | Nam et al. |
| 2002/0182307 A1* | 12/2002 | Lee ................. H01L 51/001 427/66 |
| 2004/0169748 A1 | 9/2004 | Acharya |
| 2010/0053386 A1 | 3/2010 | Sizukuisi |
| 2012/0234392 A1* | 9/2012 | Asami ............. H01L 51/4213 136/262 |
| 2013/0009138 A1 | 1/2013 | Seo et al. |
| 2013/0104968 A1* | 5/2013 | Pfeiffer .......... H01L 31/035272 136/255 |
| 2014/0239271 A1* | 8/2014 | Leem ............... H01L 51/442 257/40 |
| 2015/0174945 A1* | 6/2015 | Garnier ............ B42D 25/382 283/67 |
| 2016/0155950 A1 | 6/2016 | Kim et al. |
| 2016/0248030 A1 | 8/2016 | Zhang |
| 2016/0284747 A1 | 9/2016 | Park et al. |
| 2017/0092890 A1* | 3/2017 | Seo ................. H01L 51/5016 |
| 2017/0162807 A1* | 6/2017 | Moriwaki .......... H01L 51/0029 |
| 2017/0170347 A1 | 6/2017 | Miura et al. |
| 2017/0328776 A1 | 11/2017 | Shimasaki et al. |
| 2017/0331062 A1 | 11/2017 | Tamaki |
| 2017/0366787 A1 | 12/2017 | Nam et al. |
| 2018/0219047 A1* | 8/2018 | Tokuhara ............ G01J 5/0853 |
| 2019/0270758 A1* | 9/2019 | Inouchi ............... C07F 5/022 |

FOREIGN PATENT DOCUMENTS

| | | |
|---|---|---|
| JP | 2008-227092 A | 9/2008 |
| JP | 2010080953 A | 4/2010 |
| JP | 2012063221 A | 3/2012 |
| JP | 2012099797 A | 5/2012 |
| JP | 2016-106437 A | 6/2016 |
| JP | 6081694 B | 2/2017 |
| JP | 2017034208 A | 2/2017 |
| JP | 6160852 B2 | 7/2017 |
| KR | 1709625 | 8/2011 |
| KR | 1703311 | 9/2011 |
| KR | 20110101435 A | 9/2011 |
| KR | 20160063916 A | 6/2016 |
| KR | 20160114474 A | 10/2016 |
| TW | 201820646 A | 6/2018 |
| WO | WO-2011/053297 A1 | 5/2011 |
| WO | WO-2015/064862 A1 | 5/2015 |

OTHER PUBLICATIONS

Machida, Shin-ichi, "A 2.1Mpixel Organic-Film Stacked RGB-IR Image Sensor with Electrically Controllable IR Sensitivity", ISSCC2017/ Session 4/ Imagers/4.7, 2017 IEEE International Solid-State Circuits Conference.

Extended European Search Report dated Nov. 4, 2019 for corresponding European Application No. 19176510.6.

* cited by examiner

ORGANIC PHOTOELECTRIC DEVICES AND IMAGE SENSORS INCLUDING THE SAME

CROSS-REFERENCE TO RELATED APPLICATION

This application claims priority to and the benefit of Korean Patent Application No. 10-2018-0060395 filed in the Korean Intellectual Property Office on May 28, 2018, the entire contents of which are incorporated herein by reference.

BACKGROUND

1. Field

Organic photoelectric devices and stack-type image sensors including the same are disclosed.

2. Description of the Related Art

A demand of further improving performance of a conventional silicon photodiode-based CMOS image sensor or increasing its new applications is being increased. Particularly, research on an infrared ray (IR) wavelength absorption for expanding a conventional RGB color image sensing region through technological improvement about low illumination sensitivity enhancement and an absorption wavelength change is being actively made. In other words, a method of improving sensitivity in a low illumination situation by adding an infrared absorption to a RGB color image may be a representative example.

According to an article recently published by Panasonic Corp. (Mpixel Organic-Film Stacked RGB-IR Image Sensor with Electrically Controllable IR Sensitivity, 2017 IEEE International Solid-State Circuits Conference), research on development of a sensor for night vision and non-destructive inspection by positioning an infrared absorption layer beneath a visible absorption layer and simultaneously realizing a RGB+IR mode according to a variable voltage is being made.

Examining a cross section of a diode structure made by Panasonic Corp., a lower buffer layer, an infrared absorption layer, a visible absorption layer, and an upper buffer layer are sequentially stacked on a lower electrode, and thereon, an upper electrode is formed. In other words, in order to reinforce an infrared absorption, a stacking process of an organic material absorption layer is added by additionally including an infrared absorption layer in addition to a conventional photodiode structure of a buffer layer and/or a visible absorption layer. Particularly, the diode structure has a dual system driven by a visible light at a low voltage (a middle voltage) but simultaneously by visible light and an infrared ray at a high voltage due to organic molecule structure and property differences between the visible absorption layer and the infrared absorption layer and thus shows dependence on an operating voltage when a sensor is driven and accordingly, may have limited utility in a mobile image sensor, particularly a mobile image sensor configured to utilize a low voltage to drive one or more elements of the image sensor.

SUMMARY

Some example embodiments provide an infrared (IR) organic photoelectric device having a simplified device structure and manufactured by a simple process.

Some example embodiments provides a stack-type visible light (RGB)-IR image sensor including an organic photoelectric device.

Yet some example embodiments provide a stack-type ultraviolet (UV)-IR image sensor including an organic photoelectric device.

According to some example embodiments, an infra-red (IR) organic photoelectric device may include an anode and a cathode facing each other and an infrared absorption and hole transport composite monolayer between the anode and the cathode.

The infrared absorption and hole transport composite monolayer may include a hole transport material and a metal oxide. The hole transport material may be a material having a highest occupied molecular orbital (HOMO) level that is between a work function of the anode and a work function of the metal oxide. A difference between the HOMO level of the hole transport material and the work function of the metal oxide may range from about 0.01 eV to about 0.89 eV.

The HOMO level of the hole transport material may be greater than about 4.7 eV and less than or equal to about 5.6 eV.

The hole transport material may be a material configured to transmit visible light based on the hole transport material having an energy bandgap of about 2.8 eV to about 4.0 eV.

The infrared absorption and hole transport composite monolayer may include a hole transport material and a metal oxide having a work function level of greater than about 5.6 eV.

The hole transport material may be 4,4',4''-tris(N-(2-naphthyl)-N-phenyl-amino)-triphenylamine, N,N-diphenyl-N,N-bis(9-phenyl-9H-carbazole-3-yl)biphenyl-4,4'-diamine, N(diphenyl-4-yl)9,9-dimethyl-N-(4(9-phenyl-9H-carbazole-3-yl)phenyl)-9H-fluorene-2-amine), di-[4-(N,N-di-p-tolyl-amino)-phenyl]cyclohexane, or 9,9-bis[4-N,N-bis-biphenyl-4-yl-aminophenyl]-9H-fluorene.

The metal oxide may be molybdenum oxide or rhenium oxide.

The infrared absorption and hole transport composite monolayer may include an amount of the metal oxide that occupies a volume of greater than or equal to about 50% of a volume of the infrared absorption and hole transport composite monolayer.

The IR organic photoelectric device may further comprise an electron transport layer between the cathode and the infrared absorption and hole transport composite monolayer.

According to some example embodiments, an organic image sensor, may include an anode and a cathode facing each other, an absorption layer between the anode and the cathode, the absorption layer being a visible absorption layer or an ultraviolet (UV) absorption layer, and an infrared absorption and hole transport composite monolayer between the anode and the absorption layer.

The infrared absorption and hole transport composite monolayer may include a hole transport material and a metal oxide. The hole transport material may be a material having a highest occupied molecular orbital (HOMO) level that is between a work function of the anode and a work function of the metal oxide.

A difference between the HOMO level of the hole transport material and the work function of the metal oxide may range from about 0.01 eV to about 0.89 eV.

The HOMO level of the hole transport material may be greater than about 4.7 eV and less than or equal to about 5.6 eV.

The hole transport material may be a material configured to transmit visible light based on the hole transport material having an energy bandgap of about 2.8 eV to about 4.0 eV.

The infrared absorption and hole transport composite monolayer may include a hole transport material, and a metal oxide having a work function level of greater than about 5.6 eV.

The hole transport material may be 4,4',4"-tris(N-(2-naphthyl)-N-phenyl-amino)-triphenylamine, N,N-diphenyl-N,N-bis(9-phenyl-9H-carbazole-3-yl)biphenyl-4,4'-diamine, N(diphenyl-4-yl)9,9-dimethyl-N-(4(9-phenyl-9H-carbazole-3-yl)phenyl)-9H-fluorene-2-amine, di-[4-(N,N-di-p-tolyl-amino)-phenyl]cyclohexane, or 9,9-bis[4-N,N-bis-biphenyl-4-yl-aminophenyl]-9H-fluorene.

The metal oxide may be molybdenum oxide or rhenium oxide.

The infrared absorption and hole transport composite monolayer may include an amount of the metal oxide that occupies a volume of greater than or equal to about 50% of a volume of the infrared absorption and hole transport composite monolayer.

The organic image sensor may further include an electron transport layer between the cathode and the visible absorption layer or the UV absorption layer.

According to some example embodiments, an organic image sensor may include an anode and a cathode facing each other, an absorption layer between the anode and the cathode, and an infrared absorption and hole transport composite monolayer between the anode and the absorption layer. The absorption layer may include a plurality of layers, at least two separate layers of the plurality of layers configured to absorb different wavelength ray regions of incident light.

The plurality of layers may include a plurality of layers horizontally stacked in relation to each other on the infrared absorption and hole transport composite monolayer.

The plurality of layers may include at least two layers of the plurality of layers that are vertically stacked on at least one layer of the plurality of layers.

The plurality of layers may include a first set of at least two layers of the plurality of layers that are vertically stacked on a second set of at least two layers of the plurality of layers.

The plurality of layers may include a first set of at least two layers of the plurality of layers that are vertically stacked on a second set of at least two layers of the plurality of layers.

An interface between horizontally adjacent layers in the first set of layers may be horizontally offset from an interface between horizontally-adjacent layers of the second set of layers.

At least one layer of the plurality of layers may be configured to absorb a visible wavelength ray region of incident light, and at least one separate layer of the plurality of layers may be configured to absorb a non-visible wavelength ray region of the incident light, the non-visible wavelength ray region being an ultraviolet wavelength ray region or an infrared wavelength ray region.

At least two layers of the plurality of layers may be configured to absorb different non-visible wavelength ray regions of incident light, each non-visible wavelength ray region being an ultraviolet wavelength ray region or an infrared wavelength ray region.

An electronic device may include the organic image sensor.

DETAILED DESCRIPTION

Figure 1:
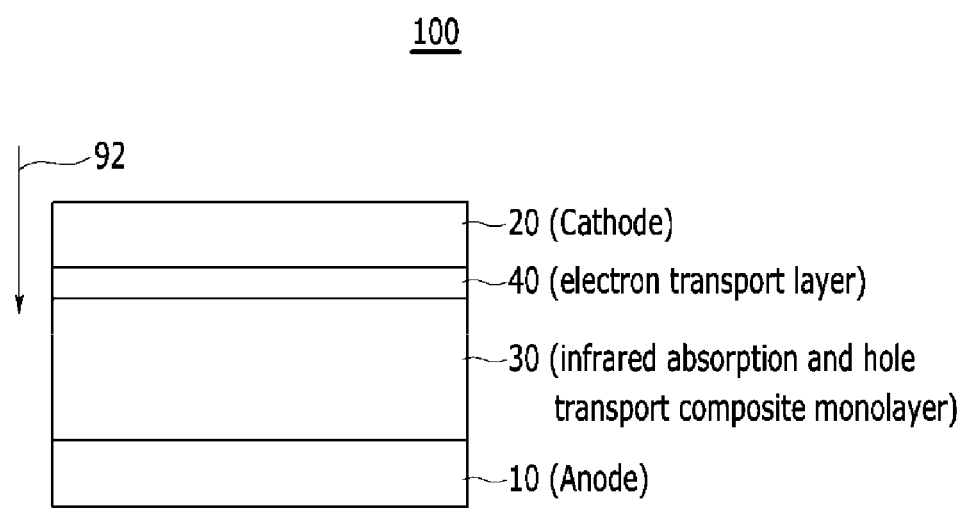
FIG. 1 is a cross-sectional view of an IR organic photoelectric device according to some example embodiments.

Hereinafter, example embodiments will be described in detail so that a person skilled in the art would understand the same. However, this disclosure may be embodied in many different forms and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

As used herein, when a definition is not otherwise provided, the term "substituted" refers to one substituted with a substituent such as a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof, instead of hydrogen of a compound.

FIG. 1 is a cross-sectional view of an IR organic photoelectric device according to some example embodiments.

Referring to FIG. 1, an IR organic photoelectric device 100 according to some example embodiments includes a first electrode 10 and a second electrode 20 facing each other and an infrared absorption and hole transport composite monolayer 30 between the first electrode 10 and the second electrode 20. An electron transport layer 40 is disposed between the infrared absorption and hole transport composite monolayer 30 and the second electrode 20, which may be a cathode or an anode.

One of the first electrode 10 and the second electrode 20 is an anode and the other is a cathode, such that the first electrode 10 and the second electrode 20 amount to an anode and a cathode facing each other. At least one of the first electrode 10 and the second electrode 20 may be a light-transmitting electrode and the light-transmitting electrode may be made of for example a transparent conductor such as indium tin oxide (ITO) or indium zinc oxide (IZO), or may be made of a metal thin film of layer of a monolayer or a plural layer having a thin thickness. When one of the first electrode 10 and the second electrode 20 is a non-light-transmitting electrode, it may be made of ("may at least partially comprise") for example an opaque conductor such as aluminum (Al).

The infrared absorption and hole transport composite monolayer 30 may absorb incident light 92 in an infrared ray wavelength region (e.g., may absorb an infrared wavelength spectrum of incident light 92), and may separate holes from excitons generated by light absorption and transport the holes into the anode 10. In other words, the infrared absorption and hole transport composite monolayer 30 may be configured to absorb light in an infrared ray wavelength region and simultaneously separate holes of excitons generated by the light absorption and thus, transport them to the anode 10. In addition, the infrared absorption and hole transport composite monolayer 30 may be configured to increase the number ("quantity") of holes moving toward the anode 10 as well as sense a low illumination through the infrared absorption and thus increase efficiency, and thus performance, of the organic photoelectric device 100 and further any electronic device (e.g., an image sensor) including the organic photoelectric device 100.

The infrared absorption and hole transport composite monolayer 30 may be formed based on codepositing a hole transport material (HTL) and a metal oxide and thus may show infrared absorption capability as well as a hole transport function. Accordingly, it will be understood that the infrared absorption and hole transport composite monolayer 30 may include a hole transport material (HTL) and a metal oxide.

Figure 2:
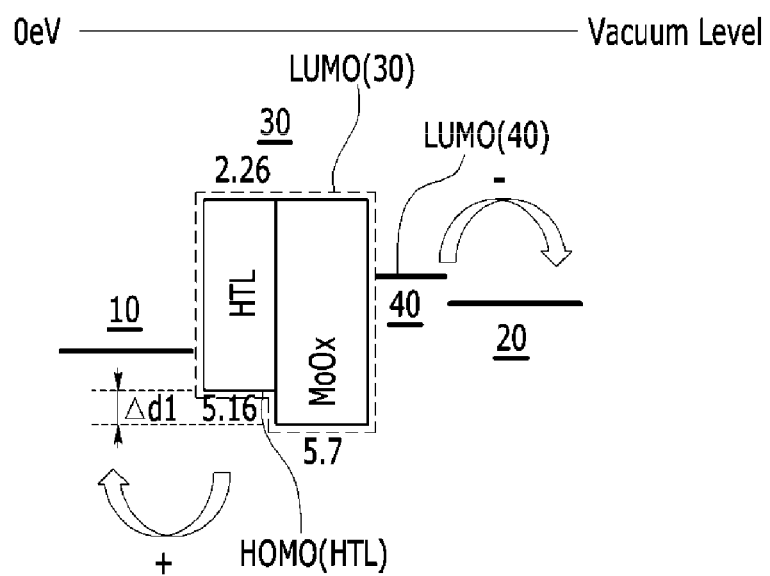
FIG. 2 is a diagram showing an energy level of the IR organic photoelectric device of FIG. 1.

The hole transport material (HTL) may have a highest occupied molecular orbital (HOMO) level that is between a work function of the anode and a work function of the metal oxide. As shown in FIG. 2, the hole transport material (HTL) has transparency capable of transmitting visible light due to an energy bandgap of greater than or equal to about 2.8 eV and simultaneously may be capable of separating and transporting holes based on the hole transport material (HTL) having a highest occupied molecular orbital (HOMO) level that is between a work function of the anode and a work function of the metal oxide. Herein, the HOMO level indicates the absolute value of a HOMO level when a vacuum level is 0 eV.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The hole transport material may have an energy bandgap of, for example, about 2.8 eV to about 4.0 eV, and the hole transport material may be a material configured to transmit visible light based on the hole transport material having an energy bandgap of about 2.8 eV to about 4.0 eV.

Figure 3:
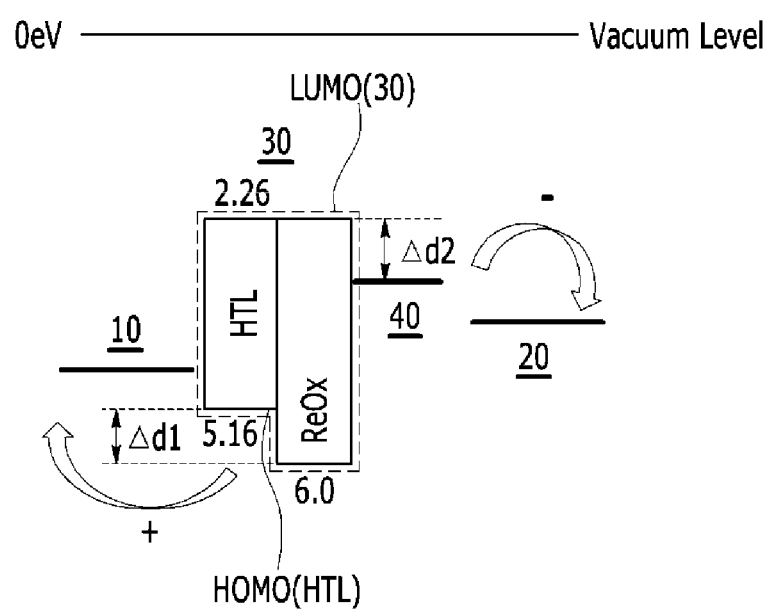
FIG. 3 is a diagram showing another energy level of the IR organic photoelectric device of FIG. 1.

The difference (Δd1) between the HOMO level of the hole transport material and the work function of the metal oxide may be, for example, about 0.01 eV to about 0.89 eV. For example, in FIG. 2 the difference (Δd1) between the HOMO level of the hole transport material and the work function of the metal oxide may be (5.7-5.16)=0.54 eV. In another example, in FIG. 3 the difference (Δd1) between the HOMO level of the hole transport material and the work function of the metal oxide may be (6.0-5.16)=0.84 eV. The HOMO level of the hole transport material may be for example greater than about 4.7 eV and less than or equal to about 5.6 eV. As shown in FIGS. 2-3, for example, the HOMO level of the hole transport material may be about 5.16 eV.

The hole transport material may include an amine-based compound. In some example embodiments, for example, the hole transport material may be 4,4',4"-tris(N-(2-naphthyl)-N-phenyl-amino)-triphenylamine, N,N-diphenyl-N,N-bis(9-phenyl-9H-carbazole-3-yl)biphenyl-4,4'-diamine, N(diphenyl-4-yl)9,9-dimethyl-N-(4(9-phenyl-9H-carbazole-3-yl)phenyl)-9H-fluorene-2-amine, di-[4-(N,N-di-p-tolyl-amino)-phenyl]cyclohexane, or 9,9-bis[4-N,N-bis-biphenyl-4-yl-aminophenyl]-9H-fluorene, or the like, but is not limited thereto.

In some example embodiments, the metal oxide may have a work function level of greater than about 5.6 eV. The metal oxide may be a material having a lower work function than the HOMO level of the hole transport material and may have a work function of greater than about 5.6 eV. In some example embodiments, the work function may range from about 5.7 eV to about 6.0 eV. In some example embodiments, the metal oxide may be molybdenum oxide (MoOx) or rhenium oxide (ReOx). FIG. 2 shows an energy diagram when molybdenum oxide (MoOx) having a work function level of about 5.7 eV is the metal oxide and FIG. 3 shows an energy diagram when rhenium oxide (ReOx) having a work function level of about 6.0 eV is the metal oxide, but example embodiments are not limited thereto. In FIGS. 2 and 3, HTL and the metal oxide (MoOx and/or ReOx) are separately shown for better comprehension and ease of description but actually codeposited together, and accordingly, an energy diagram thereof may be mixed.

The hole transport material included in the infrared absorption and hole transport composite monolayer 30 may be included in an amount of less than or equal to about 50 volume % based on the infrared absorption and hole transport composite monolayer 30. Restated, the infrared absorption and hole transport composite monolayer 30 may include an amount of the hole transport material that occupies a volume of less than or equal to 50% of a volume of the infrared absorption and hole transport composite monolayer 30. Within the range, it may be included in an amount of about 0.01 volume % to about 20 volume %, for example about 0.01 volume % to about 10 volume %.

The metal oxide included in the infrared absorption and hole transport composite monolayer 30 may be included in an amount of greater than or equal to about 50 volume % based on the infrared absorption and hole transport composite monolayer 30. Restated, the infrared absorption and hole transport composite monolayer 30 may include an amount of the metal oxide that occupies a volume of greater than or equal to 50% of a volume of the infrared absorption and hole transport composite monolayer 30. Within the range, it may be included in an amount of 80 volume % to about 99.9 volume % for example about 90 volume % to about 99.9 volume % for example about 90 volume % to about 99 volume %.

The electron transport layer 40 may be configured to separate electrons of excitons generated by the infrared absorption and hole transport composite monolayer 30 and transport them toward the cathode 20 while it does not substantially absorb light in a visible region (e.g., a visible wavelength spectrum of incident light 92). In other words, the electron transport layer 40 may be configured to increase the number ("quantity") of electrons moving toward the cathode 20 and thus increase efficiency of the organic photoelectric device 100.

Accordingly, the electron transport layer 40 may include an electron transport material. The electron transport material has transparency capable of transmitting visible light due to an energy bandgap of greater than or equal to about 2.8 eV and simultaneously has a LUMO level between the work function of the cathode 20 and a LUMO level of a visible light absorber. Herein, the LUMO level indicates the absolute value of a LUMO level when a vacuum level is 0 eV. The electron transport material may have an energy bandgap of, for example, about 2.8 eV to about 4.0 eV.

As shown in FIGS. 2 and 3, the LUMO level of the electron transport layer 40 may have a higher level ("magnitude") than the work function of the second electrode 20 that is a cathode. The LUMO level of the electron transport material may be, for example, greater than about 3.6 eV and less than 4.3 eV. For example, the difference (Δd2) between the LUMO level of the electron transport layer 40 and the LUMO level of the infrared absorption and hole transport composite monolayer 30 (about 2.26 eV) may be, for example, about 0.01 eV to about 0.84 eV.

The electron transport material may be, for example, carboxylic acid anhydride, for example 1,4,5,8-naphthalene tetracarboxylic dianhydride, but is not limited thereto.

The IR organic photoelectric device shown in FIG. 1 may be applied to an image sensor of a digital camera, an image sensor of a camera for a mobile phone, an infrared ray camera and an image sensor of CCTV, an image sensor of a camera for PC communication, an X ray detection sensor, and the like but is not limited thereto.

Figure 4:
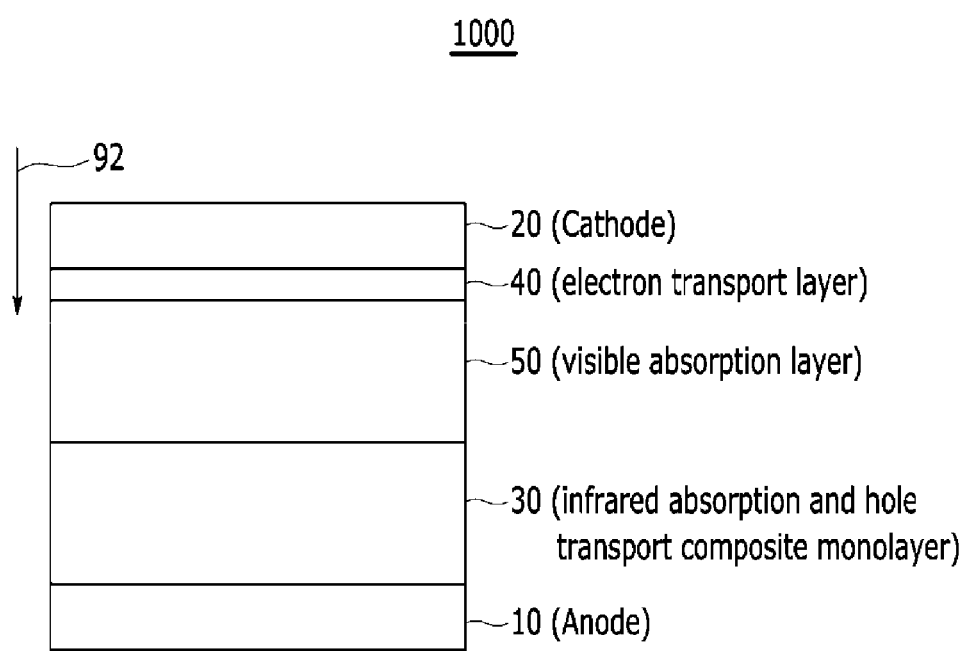
FIG. 4 is a cross-sectional view of a RGB-IR organic image sensor according to some example embodiments.
Figure 5:
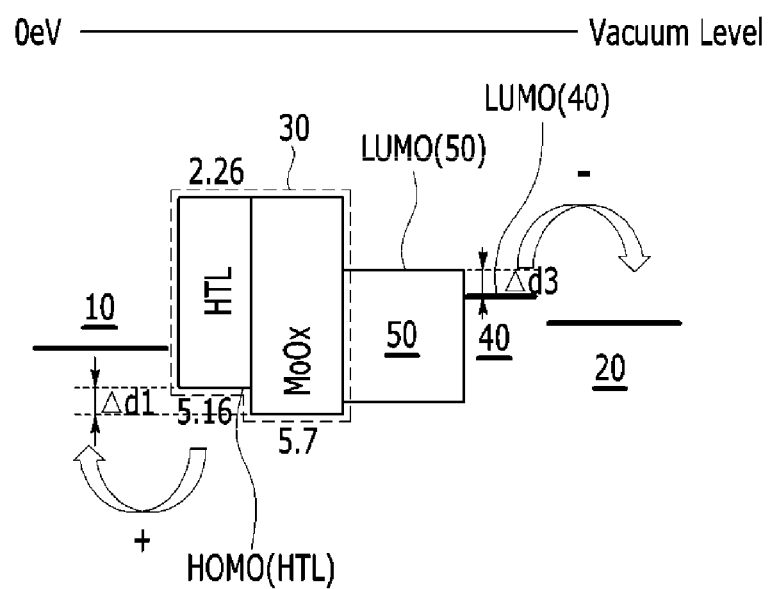
FIG. 5 is a diagram showing an energy level of the RGB-IR organic image sensor of FIG. 4.
Figure 6:
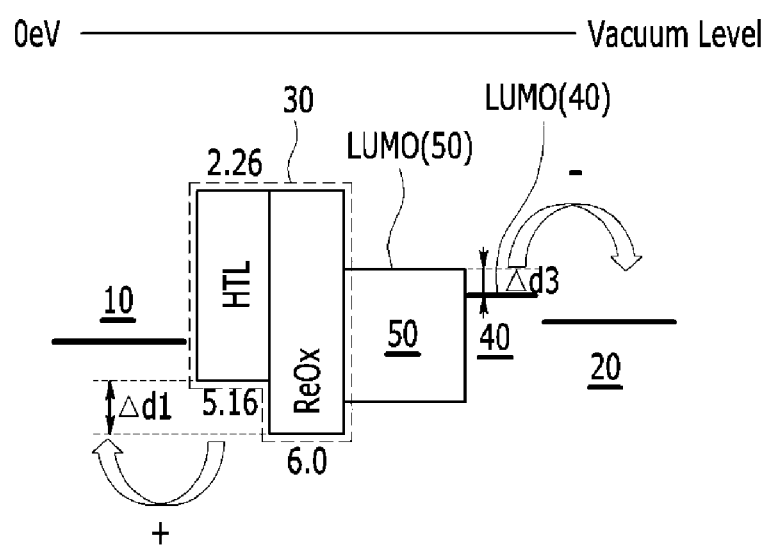
FIG. 6 is another diagram showing an energy level of the RGB-IR organic image sensor of FIG. 4.
Figure 7:
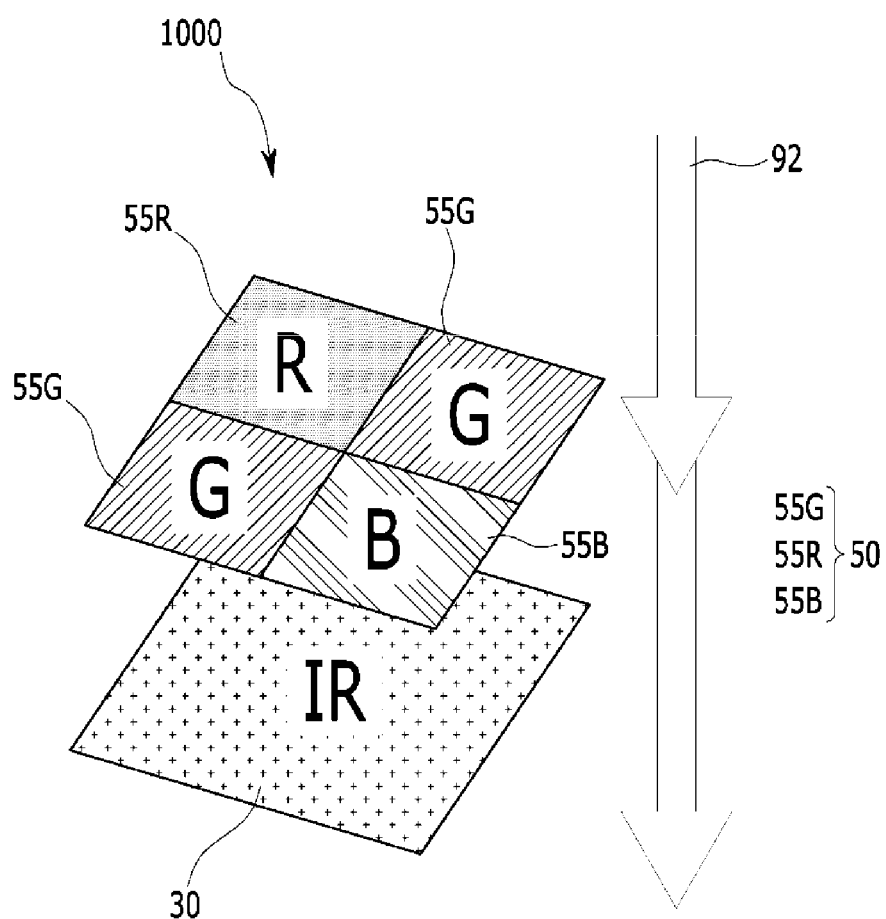
FIG. 7 is a schematic top perspective view of the RGB-IR image sensor of FIG. 4.
Figure 8:
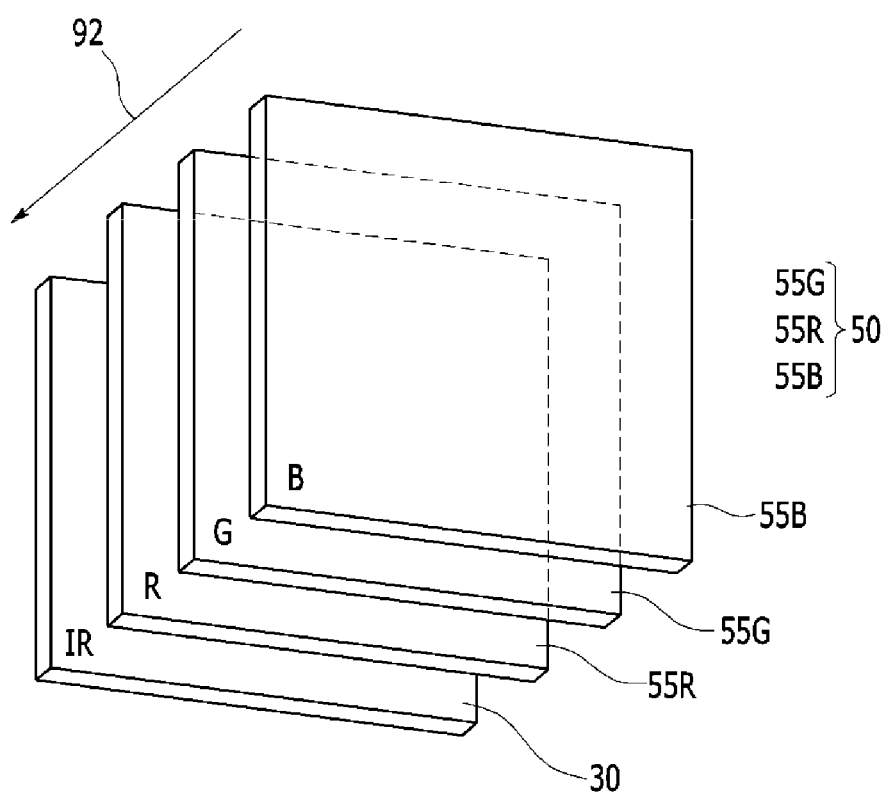
FIG. 8 is another schematic top perspective view of the RGB-IR image sensor of FIG. 4.

FIG. 4 is a cross-sectional view of an organic stack-type RGB-IR image sensor 1000 according to some example embodiments, FIGS. 5 and 6 show different energy diagrams of organic stack-type RGB-IR image sensors, respectively, and FIGS. 7 and 8 are different top plan views of organic stack-type RGB-IR image sensors.

Referring to FIG. 4, the organic stack-type RGB-IR image sensor 1000 includes a first electrode 10 and a second electrode 20 and a visible absorption layer 50 disposed between the first electrode 10 and the second electrode 20. An infrared absorption and hole transport composite monolayer 30 is included on one surface of the visible absorption layer 50 and an electron transport layer 40 is included on the other surface thereof. As shown in FIG. 4, the infrared absorption and hole composite monolayer 30 is between the first electrode 10 and the second electrode 20. The infrared absorption and hole composite monolayer 30 may have same or similar properties, compositions, characteristics, some combination thereof, or the like with reference to the infrared absorption and hole composite monolayer 30 described above with reference to FIGS. 1-3 and thus a detailed description of the infrared absorption and hole composite monolayer 30 is not repeated herein with reference to FIGS. 4-6.

One of the first electrode 10 and the second electrode 20 is an anode and the other is a cathode, such that the first electrode 10 and the second electrode 20 amount to an anode and a cathode facing each other. At least one of the first electrode 10 and the second electrode 20 may be a light-transmitting electrode and the light-transmitting electrode may be made of ("may at least partially comprise") for example a transparent conductor such as indium tin oxide (ITO) or indium zinc oxide (IZO), or may be made of a metal thin film or layer of a monolayer or a plural layer having a thin thickness. When one of the first electrode 10 and the second electrode 20 is a non-light-transmitting electrode, it may be made of ("may at least partially comprise") for example an opaque conductor such as aluminum (Al).

The visible absorption layer 50 includes a visible light absorber absorbing light in a particular wavelength region of the visible region.

The visible light absorber may selectively absorb light in a green wavelength region, light in a blue wavelength region, or light in a red wavelength region of the visible region as an n-type semiconductor or a p-type semiconductor and may have a maximum absorption wavelength (λmax) in a range of about 400 nm to about 700 nm.

When the light in a green wavelength region is absorbed, the visible light absorber may be a compound (subphthalocyanine derivative) represented by Chemical Formula 1.

[Chemical Formula 1]

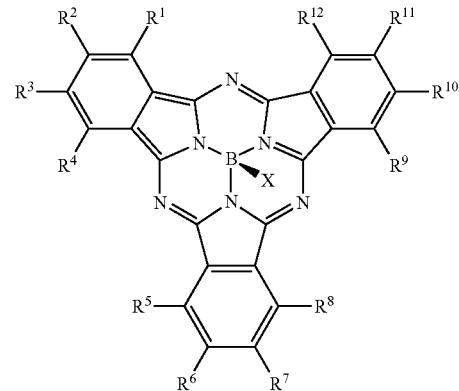

In Chemical Formula 1,
$R^1$ to $R^{12}$ are independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof, and
X is an anion.

The compound represented by Chemical Formula 1 may be a visible light absorber having a maximum absorption wavelength (λmax) in a range of about 500 nm to about 600 nm and may have wavelength selectivity in a green wavelength region.

The compound represented by Chemical Formula 1 may function as an n-type semiconductor or a p-type semiconductor and may be included alone as a visible light absorber without a separate p-type semiconductor or n-type semiconductor that forms a pn junction.

The compound represented by Chemical Formula 1 may be for example one of compounds represented by Chemical Formulae 1a to 1e, but is not limited thereto.

[Chemical Formula 1a]

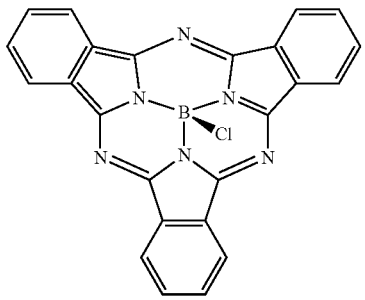

[Chemical Formula 1b]

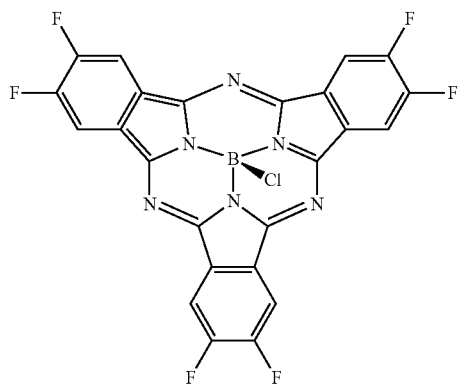

[Chemical Formula 1c]

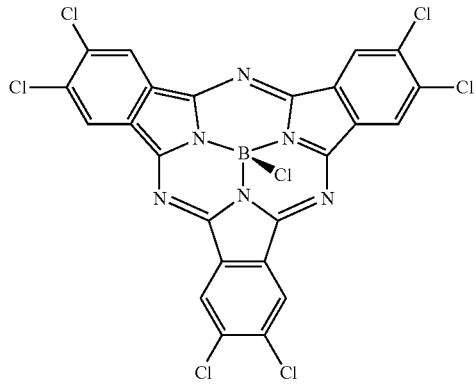

[Chemical Formula 1d]

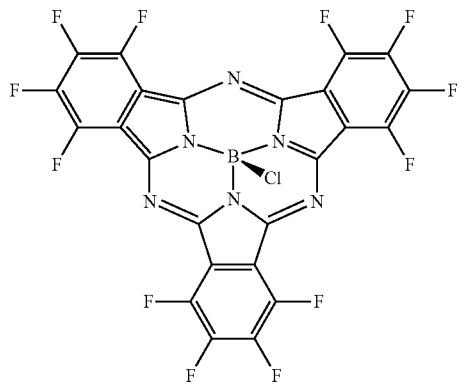

[Chemical Formula 1e]

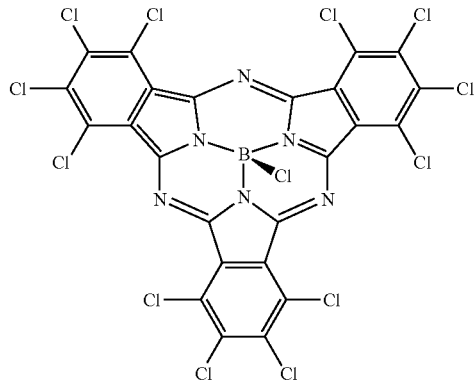

When the light in a red wavelength region is absorbed, the visible light absorber may be CuPc (copper phthalocyanine) or ZnPc (zinc phthalocyanine).

When the light in a blue wavelength region is absorbed, the visible light absorber may be BP3T (biphenyl tri-thiophene) or $C_{60}$.

The infrared absorption and hole transport composite monolayer 30 may absorb light in an infrared ray wavelength region and then may separate holes of excitons generated by the infrared ray absorption from holes of excitons generated by visible light absorption of the visible absorption layer 50 and thus may transport them toward the anode 10. Accordingly, the infrared absorption and hole transport composite monolayer 30 may play a role of increasing the number ("quantity") of holes moved toward the anode 10 as well as improving low illumination sensitivity through the infrared absorption and thus increasing efficiency, and thus performance, of the organic photoelectric device 100 and thus any electronic device (e.g., an image sensor) including the organic photoelectric device 100.

The infrared absorption and hole transport composite monolayer 30 formed by codepositing a hole transport material and a metal oxide may show infrared absorption capability as well as a hole transport function.

As shown in FIG. 5, the hole transport material (HTL) has transparency capable of transmitting light due to an energy bandgap of greater than or equal to about 2.8 eV and simultaneously may be capable of separating and transporting holes due to a HOMO level between a work function of the anode 10 and a work function of the metal oxide (e.g., a HOMO level of about 5.16 eV). Herein, the HOMO level indicates the absolute value of a HOMO level when a vacuum level is 0 eV.

The hole transport material may have an energy bandgap of, for example, about 2.8 eV to about 4.0 eV.

The difference between the HOMO level of the hole transport material (e.g., about 5.16 eV) and the work function of the metal oxide (e.g., about 5.7 eV as shown in FIG. 5, about 6.0 eV as shown in FIG. 6) may be, for example, about 0.01 eV to about 0.84 eV. The HOMO level of the hole transport material may be for example greater than about 4.7 eV and less than or equal to about 5.6 eV.

The hole transport material an amine-based compound, for example 4,4',4''-tris(N-(2-naphthyl)-N-phenyl-amino)-triphenylamine, N,N-diphenyl-N,N-bis(9-phenyl-9H-carbazole-3-yl)biphenyl-4,4'-diamine, N(diphenyl-4-yl)9,9-dimethyl-N-(4(9-phenyl-9H-carbazole-3-yl)phenyl)-9H-fluorene-2-amine, di-[4-(N,N-di-p-tolyl-amino)-phenyl]

cyclohexane, or 9,9-bis[4-N,N-bis-biphenyl-4-yl-amino)phenyl]-9H-fluorene, or the like, but is not limited thereto.

In some example embodiments, the metal oxide may have a work function level of greater than about 5.6 eV. The metal oxide may be a material having a lower work function than the HOMO level of the hole transport material and may have a work function of greater than about 5.6 eV. In some example embodiments, the work function may range from about 5.7 eV to about 6.0 eV. In some example embodiments, the metal oxide may be molybdenum oxide (MoOx) or rhenium oxide (ReOx). FIG. 5 shows an energy diagram when molybdenum oxide (MoOx) having a work function level of about 5.7 eV is the metal oxide, and FIG. 6 shows an energy diagram when rhenium oxide (ReOx) having a work function level of about 6.0 eV is the metal oxide, but example embodiments are not limited thereto.

The hole transport material included in the infrared absorption and hole transport composite monolayer 30 may be included in an amount of less than or equal to about 50 volume % based on the infrared absorption and hole transport composite monolayer 30. Restated, the infrared absorption and hole transport composite monolayer 30 may include an amount of the hole transport material that occupies a volume of less than or equal to 50% of a volume of the infrared absorption and hole transport composite monolayer 30. Within the range, it may be included in an amount of about 0.01 volume % to about 20 volume %, for example about 0.01 volume % to about 10 volume %.

The metal oxide included in the infrared absorption and hole transport composite monolayer 30 may be included in an amount of greater than or equal to about 50 volume % based on the infrared absorption and hole transport composite monolayer 30. Restated, the infrared absorption and hole transport composite monolayer 30 may include an amount of the metal oxide that occupies a volume of greater than or equal to 50% of a volume of the infrared absorption and hole transport composite monolayer 30. Within the range, it may be included in an amount of about 80 volume % to about 99 volume % for example about 90 volume % to about 99.9 volume %.

The electron transport layer 40 may be configured to separate electrons of excitons generated by the infrared absorption and hole transport composite monolayer 30 and by the visible light absorption layer 50 and thus transport them toward the cathode 20 while it does not substantially absorbing light in a visible region. In other words, the electron transport layer 40 may be configured to increase the number of electrons moving toward the cathode 20 and thus efficiency, and thus performance, of an RGB-IR image sensor 1000, and thus the performance of any electronic device including the RGB-IR image sensor 1000.

Accordingly, the electron transport layer 40 may include an electron transport material. The electron transport material has transparency capable of transmitting visible light due to an energy bandgap of greater than or equal to about 2.8 eV and simultaneously has a LUMO level between the work function of the cathode 20 and a LUMO level of a visible light absorber. Herein, the LUMO level indicates the absolute value of a LUMO level when a vacuum level is 0 eV. The electron transport material may have an energy bandgap of, for example, about 2.8 eV to about 4.0 eV.

As shown in FIGS. 5 and 6, the LUMO level of the electron transport layer 40 may be between the work function of the second electrode 20 that is a cathode and the LUMO level of the visible absorption layer 50. The LUMO level of the electron transport material may be, for example, greater than about 3.6 eV and less than 4.3 eV. For example, the difference (Δd3) between the LUMO level of the electron transport layer 40 and the LUMO level of the visible absorption layer 50 may be, for example, about 0.01 eV to about 0.84 eV.

The electron transport material may be, for example, carboxylic acid anhydride, for example 1,4,5,8-naphthalene tetracarboxylic dianhydride, but is not limited thereto.

Figure 9:
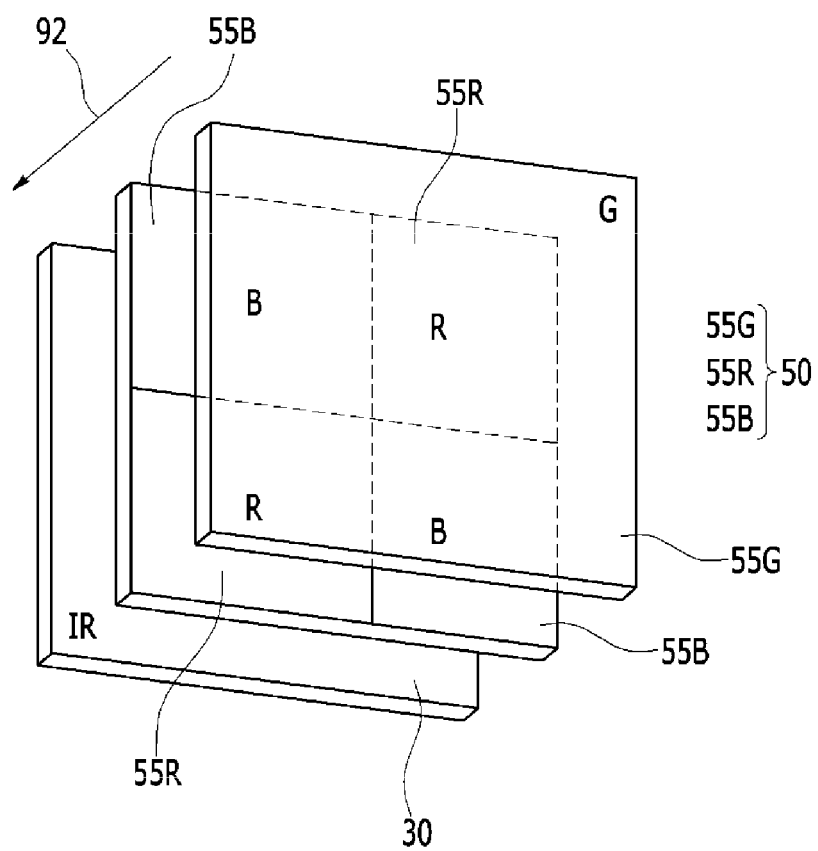
FIG. 9 is another schematic top perspective view of the RGB-IR image sensor of FIG. 4.

FIGS. 7 to 9 are various top perspective views showing an organic stack-type RGB-IR image sensor 1000. The organic stack-type RGB-IR image sensor 1000 may be formed by arranging a red organic photoelectric device 55R, a green organic photoelectric device 55G, and a blue organic photoelectric device 55B as Bayer shape in a monolayer on an IR organic photoelectric device 100 including the infrared absorption and hole transport composite monolayer 30, as shown in FIG. 7. Each organic photoelectric device 55R, 55B, 55G may include a separate visible absorption layer 50 configured to absorb a different wavelength ray region of visible light. As formed like FIG. 7, all the image sensors are formed as an organic layer to realize a flexible image sensor.

In some example embodiments, the organic stack-type RGB-IR image sensor 1000 has a structure of stacking a red organic photoelectric device, a green organic photoelectric device, and blue organic photoelectric device on an IR organic photoelectric device on the infrared absorption and hole transport composite monolayer 30, as shown in FIG. 8, and thus may be down-sized and reduces a crosstalk, thereby improving the performance of the image sensor 1000. In addition, as shown FIG. 9, sensitivity of the organic stack-type RGB-IR image sensor 1000 may be much improved by forming a green organic photoelectric device (55G) into one layer and a red organic photoelectric device (55R) and a blue organic photoelectric device (55B) arranged as a Bayer shape into another layer on an IR organic photoelectric device including the infrared absorption and hole transport composite monolayer 30.

Referring to FIGS. 4 to 9, the organic stack-type RGB-IR image sensor 1000 may include the infrared absorption and hole transport composite monolayer 30 formed as a single thin film unlike a conventional image sensor in which an infrared absorption layer and a hole transport buffer layer are formed as two layers and thus may simultaneously absorb visible light (a visible wavelength ray region of incident light 92) and an infrared ray (an infrared wavelength ray region of incident light 92) under a low voltage driving condition (e.g., about 3 V). Accordingly, sensitivity under a low illumination may be improved. Therefore, the organic stack-type RGB-IR image sensor 1000 may be used as a sensor for night vision or non-destructive inspection, thereby providing improved utility.

Figure 10:
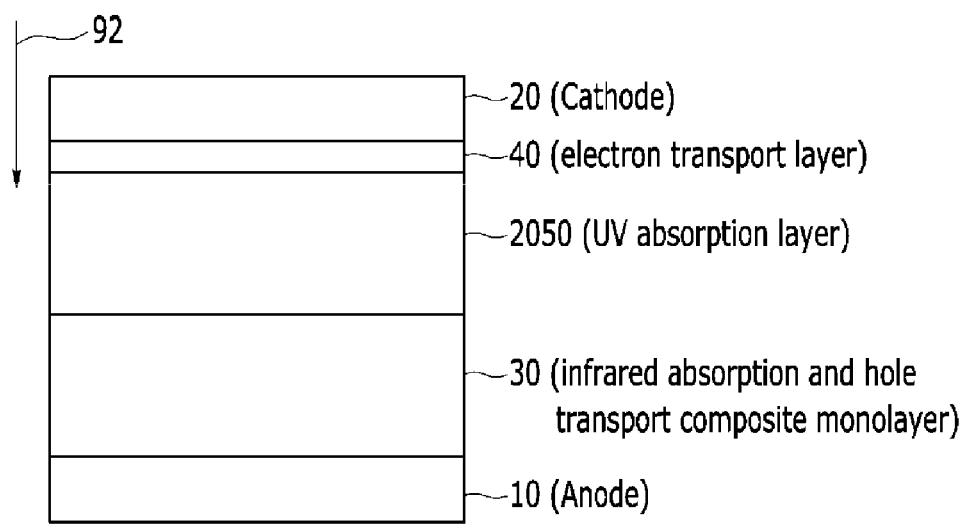
FIG. 10 is a cross-sectional view of a UV-IR organic image sensor according to some example embodiments.

FIG. 10 is a cross-sectional view of an organic stack-type UV-IR image sensor including an IR organic photoelectric device.

Referring to FIG. 10, the organic stack-type UV-IR image sensor 2000 has the same basic structure as the organic stack-type RGB-IR image sensor 100 except for forming a non-visible absorption layer 2050 and specifically, a UV absorption layer instead of the visible absorption layer 50 in the organic stack-type RGB-IR image sensor 1000 shown in FIG. 4. For example, the infrared absorption and hole composite monolayer 30 may have same or similar properties, compositions, characteristics, some combination thereof, or the like with reference to the infrared absorption and hole composite monolayer 30 described above with reference to FIGS. 4-6 and thus FIGS. 1-3 and thus a detailed description of the infrared absorption and hole composite monolayer 30 is not repeated herein with reference to FIG. 10. Collectively, the visible absorption layer 50 and the UV absorption layer 2050 may be referred to as an absorption layer, such that it will be understood that an organic image sensor (e.g., image sensor 1000, image sensor 2000, or the like) may include first and second electrodes 10 and 20 facing each other, an absorption layer between the first and second electrodes 10 and 20, and an infrared absorption and hole transport composite monolayer between an anode, of the first and second electrodes 10 and 20, and the absorption layer. As shown in FIG. 4, the absorption layer may be a visible absorption layer 50. As shown in FIG. 10, the absorption layer may be a UV absorption layer 2050.

The non visible light (UV) absorption layer 2050 may be formed of an n-type material capable of absorbing UV or a BHJ (bulk heterojunction)-type material prepared by mixing n-type and p-type materials. A nonvisible light absorption material may include NTCDA (naphthalene tetracarboxylic dianhydride), NTCDI (naphthalene tetracarboxylic diimide), and the like.

The organic stack-type UV-IR image sensor 2000 shown in FIG. 10 may simultaneously absorb UV light (incident light 92 in a UV wavelength ray region) and infrared light (incident light 92 in an infrared wavelength ray region) under a low voltage driving condition and thus may be applied to a diagnosis sensor, a special sensor, and the like.

Hereinafter, the present disclosure is illustrated in more detail with reference to examples. However, these examples are exemplary, and the present disclosure is not limited thereto.

Measurement of Light Absorption Characteristics

Light absorption characteristics in a thin film state are evaluated by preparing a sample 1 (①) formed as a 80 nm-thick thin film by thermally evaporating TNATA (4,4', 4"-tris(N-(2-naphthyl)-N-phenyl-amino)-triphenylamine) [a highest occupied molecular orbital (HOMO) level: 5.16 eV] under high vacuum (<$10^{-7}$ Torr) at a rate of 0.5 to 1.0 Å/s, a sample 2 (②) obtained by codepositing TNATA [a highest occupied molecular orbital (HOMO) level: 5.16 eV] and rhenium oxide (ReOx) [a work function: 6.0 eV] in a volume ratio of 1:1 under the same condition, and a sample 3 (③) obtained by codepositing TNATA [a highest occupied molecular orbital (HOMO) level: 5.16 eV] and molybdenum oxide (MoOx) [a work function: 5.7 eV] in a volume ratio of 1:1 under the same condition and then, radiating a visible ray-infrared ray (Vis-IR) by using Cary 5000 UV spectroscopy (Varian Medical Systems Inc.) to measure their extinction coefficients. The results are shown in FIG. 11.

Figure 12:
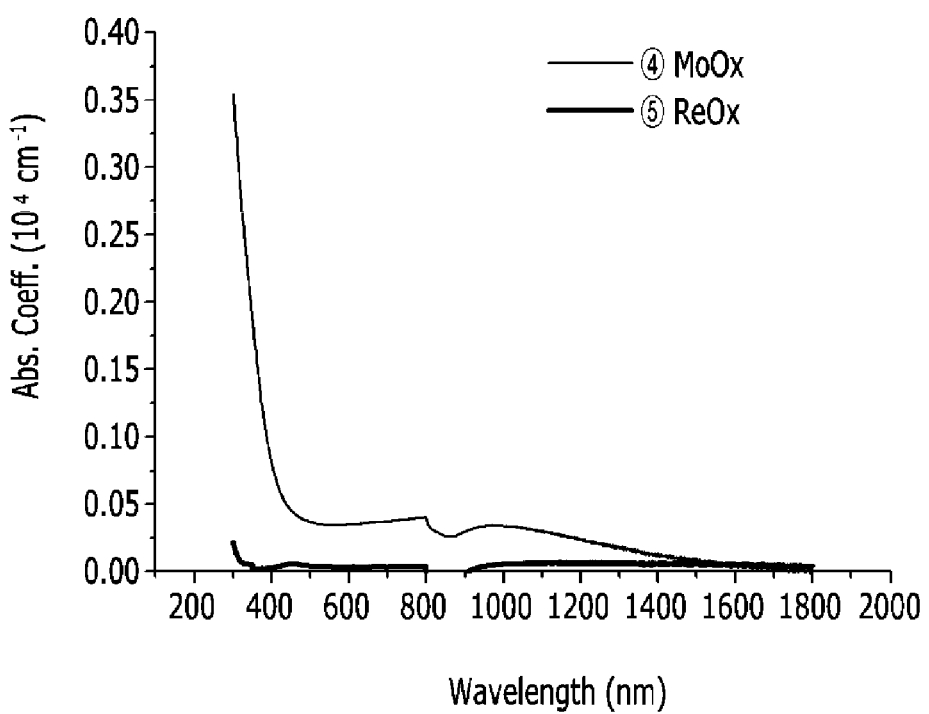
FIG. 12 is a graph showing an extinction coefficient of a metal oxide thin film.

In some example embodiments, a sample (④) is prepared by depositing only rhenium oxide (ReOx) [a work function: 6.0 eV], a sample (⑤) is prepared by depositing only molybdenum oxide (MoOx) [a work function: 5.7 eV] under the same condition, and then, their extinction coefficients are measured in the same method as above, and the results are shown in FIG. 12.

Figure 11:
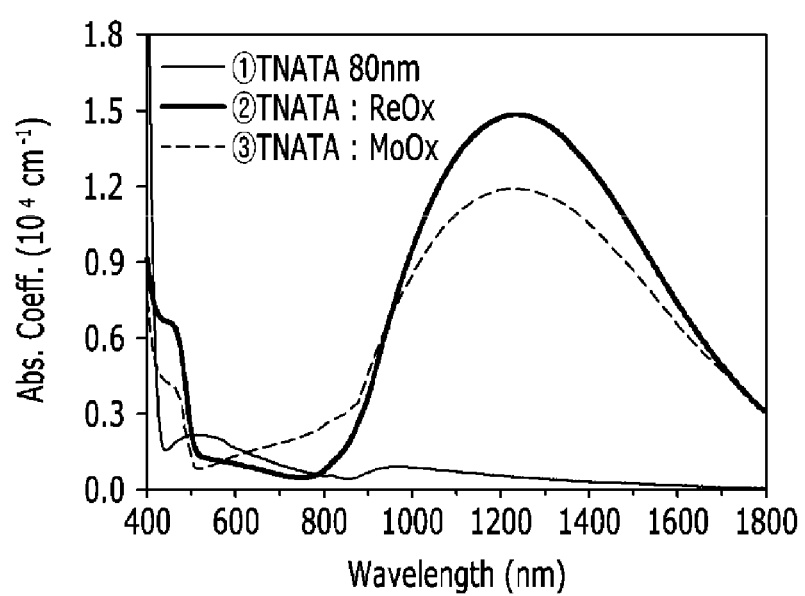
FIG. 11 is a graph showing an absorption coefficient of a codeposition thin film of a hole transport material and metal oxide.

Referring to the results of ①, ④, and ⑤ of FIGS. 11 and 12, infrared absorption capability may not be obtained only by the hole transport material (TNATA) or a metal oxide (MoOx or ReOx). On the contrary, the codeposition thin film (②) of a hole transport material (TNATA) and rhenium oxide or the codeposition thin film (③) of a hole transport material (TNATA) and molybdenum oxide show capability of absorbing light in a short wavelength infrared region ranging from 1000 nm to 1500 nm.

Measurement of External Quantum Efficiency (EQE)

Experimental Example 1: Manufacture of RGB-IR Reflective Image Sensor

ITO (a work function: 4.7 eV) is sputtered on a glass substrate to form an about 100 nm-thick anode, and then, TNATA and molybdenum oxide (MoOx) are codeposited thereon in a volume ratio of 1:1 to form in a 50 nm-thick infrared absorption and hole transport composite monolayer. Subsequently, a compound represented by Chemical Formula 1a is deposited to form a visible absorption layer. On the visible absorption layer, a 50 nm-thick active layer is formed. Subsequently, on the active layer, an electron transport layer is formed of 1,4,5,8-naphthalene tetracarboxylic dianhydride, and then, aluminum (Al) is thermally evaporated to form a 70 nm-thick cathode and thus manufacture a RGB-IR reflective image sensor.

Experimental Example 2: Manufacture of RGB-IR Reflective Image Sensor

A RGB-IR reflective image sensor is manufactured according to the same method as Experimental Example 1 except for forming a 50 nm-thick infrared absorption and hole transport composite monolayer by codepositing TNATA and rhenium oxide (ReOx) in a volume ratio of 1:1.

Comparative Example 1: Manufacture of Reflective Image Sensor

A reflective image sensor is manufactured according to the same method as Experimental Example 1, except for forming a hole transport layer by depositing TNATA to be 50 nm thick instead of the infrared absorption and hole transport composite monolayer on the anode.

Experimental Example 3: Manufacture of RGB-IR Transmissive Image Sensor

An about 100 nm-thick anode is formed by sputtering ITO on a glass substrate, and a 50 nm-thick infrared absorption and hole transport composite monolayer is formed thereon by codepositing TNATA and molybdenum oxide (MoOx) in a volume ratio of 1:1. Subsequently, a visible absorption layer is formed by depositing a compound represented by Chemical Formula 1a. On the visible absorption layer, a 50 nm-thick active layer is formed. On the active layer, an electron transport layer is formed of 1,4,5,8-naphthalene tetracarboxylic dianhydride, and an about 70 nm-thick cathode is formed thereon by sputtering ITO to manufacture a RGB-IR transmissive image sensor.

Experimental Example 4: Manufacture of RGB-IR Transmissive Image Sensor

A RGB-IR transmissive image sensor is manufactured according to the same method as Experimental Example 3 except for forming a 50 nm-thick infrared absorption and hole transport composite monolayer by codepositing TNATA and rhenium oxide (ReOx) in a volume ratio of 1:1.

Comparative Example 2: Manufacture of Transmissive Image Sensor

A transmissive image sensor is manufactured according to the same method as Experimental Example 3 except for forming a hole transport layer by depositing TNATA to be 50 nm thick on an anode instead of the infrared absorption and hole transport composite monolayer.

Measurement of External Quantum Efficiency (EQE)

External quantum efficiency (EQE) is measured by using an IPCE measurement system (McScience Inc., Korea). First, the IPCE measurement system is calibrated by using a Si photodiode (Hamamatsu Photonics K.K., Japan) and then, mounted on each image sensor according to Examples 1 to 4 and Comparative Examples 1 and 2, and their external quantum efficiency in a wavelength ranging from about 400 to 1800 nm is measured.

Figure 13:
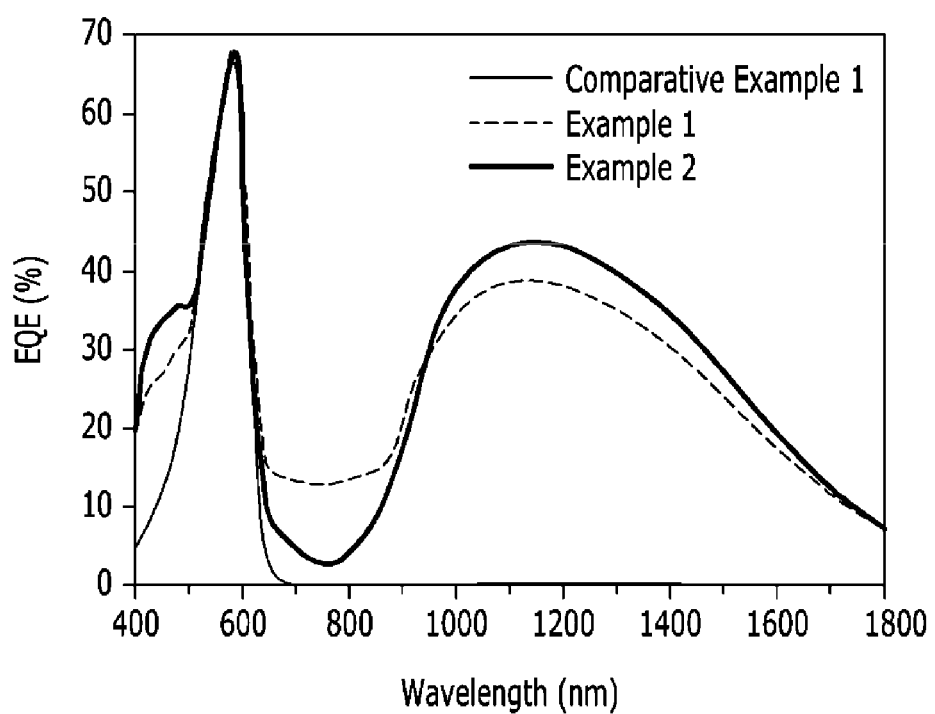
FIG. 13 is a graph showing external quantum efficiency (EQE) depending on a wavelength of the image sensors according to Examples 1 and 2 and Comparative Example 1.
Figure 14:
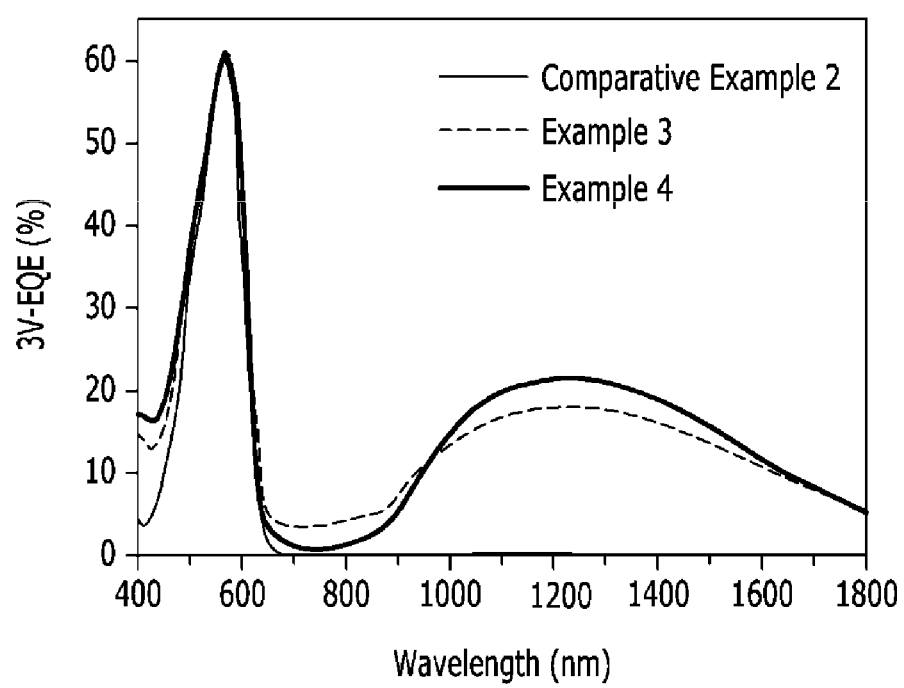
FIG. 14 is a graph showing external quantum efficiency (EQE) depending on a wavelength of the image sensors according to Examples 3 and 4 and Comparative Example 2.

FIG. 13 is a graph showing external quantum efficiency (EQE) depending on a wavelength of the image sensors according to Examples 1 and 2 and Comparative Example 1 and FIG. 14 is a graph showing external quantum efficiency (EQE) at 3 V depending on a wavelength of the image sensors according to Examples 3 and 4 and Comparative Example 2.

Referring to FIGS. 13 and 14, the organic photoelectric devices according to Examples 1 to 4 show sufficient external quantum efficiency (EQE) in a green wavelength region of about 500 nm to 600 nm and simultaneously, in a short wavelength infrared (Short Wavelength InfraRed, SWIR) region of 1000 to 1500 nm.

In addition, since external quantum efficiency (EQE) of a short wavelength infrared ray shows greater than or equal to 10% (FIG. 14) or greater than or equal to 30% (FIG. 13) at a driving voltage of 1 V or 3 V, the organic photoelectric devices according to Examples 1 to 4 turns out to be driven at a low voltage.

FIGS. 15A, 15B, 15C, and 15D are cross-sectional views of organic image sensors according to some example embodiments.

Referring generally to FIGS. 15A-15D, an organic image sensor 1500A, 1500B, 1500C, and/or 1500D may include a first electrode 10 and a second electrode 20 facing each other. In the example embodiments shown, the first electrode 10 may be an anode and the second electrode 20 may be a cathode, but example embodiments are not limited thereto. As further shown generally in FIGS. 15A-15D, an organic image sensor 1500A, 1500B, 1500C, and/or 1500D may include one or more absorption layers 60 between the first and second electrodes 10, 20 and an infrared absorption and hole transport composite monolayer 30 between the first electrode 10 (e.g., an anode) and the absorption layer 60. The organic image sensor 1500A, 1500B, 1500C, and/or 1500D may further include an electron transport layer 40 between the second electrode 20 (e.g., a cathode) and the absorption layer 60, although in some example embodiments the electron transport layer 40 may be omitted from the organic image sensor 1500A, 1500B, 1500C, and/or 1500D.

In some example embodiments, the absorption layer 60 may be a single, continuous layer. For example, the absorption layer 60 may be a single visible absorption layer 50 or a single UV absorption layer 2050.

Referring now to FIGS. 15A-15D, the absorption layer 60 may include multiple layers 60-1 to 60-N (N being a positive integer). At least two separate layers of the layers 60-1 to 60-N may be configured to absorb different wavelength ray regions of incident light 92. For example, at least one layer of the layers 60-1 to 60-N may be configured to absorb a visible wavelength ray region of incident light, and at least one separate layer of the layers 60-1 to 60-N may be configured to absorb a non-visible wavelength ray region of the incident light, the non-visible wavelength ray region being an ultraviolet wavelength ray region or an infrared wavelength ray region. At least two layers of the layers 60-1 to 60-N may be configured to absorb different non-visible wavelength ray regions of incident light, each non-visible wavelength ray region being an ultraviolet wavelength ray region or an infrared wavelength ray region.

Different layers of the layers 60-1 to 60-N may be stacked in a vertical direction D1 and/or in a horizontal direction D2. As shown, direction D1 extends orthogonal or substantially orthogonal (e.g., orthogonal within manufacturing tolerances and/or material tolerances) to a surface 30S of the infrared absorption and hole transport composite monolayer 30, and direction D2 extends parallel or substantially parallel (e.g., parallel within manufacturing tolerances and/or material tolerances) to surface 30S. Different layers 60-1 to 60-N may be configured to absorb different wavelength ray regions of incident light 92. Such different wavelength ray regions may include one or more visible wavelength ray regions, one or more infrared wavelength ray regions, and one or more ultraviolet wavelength ray regions. Each separate layer 60-1 to 60-N may be a different one of a visible absorption layer 50 or a UV absorption layer 2050. In some example embodiments, separate layers 60-1 to 60-N may be different visible absorption layers 50 that are configured to absorb different wavelength ray regions of incident light 92. For example, at least some separate layers 60-1 to 60-N may be a different one of absorption layers of the organic photoelectric devices 55G, 55B, and/or 55R. In some example embodiments, separate layers 60-1 to 60-N may be different UV absorption layers that are configured to absorb different wavelength ray regions of incident light 92.

Figure 15A:
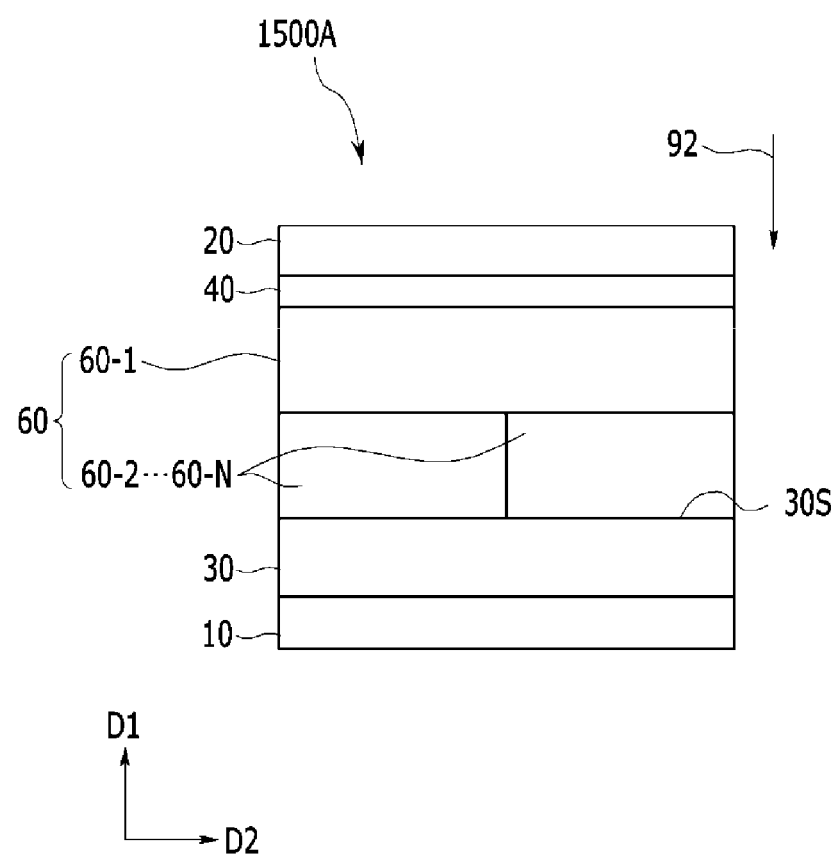
FIGS. 15A, 15B, 15C, and 15D are cross-sectional views of organic image sensors according to some example embodiments.

As shown in FIG. 15A, the absorption layer 60 may include a stack of multiple layers 60-1 to 60-N that includes layers 60-2 to 60-N that are stacked horizontally (e.g., in direction D2) in relation to each other and are collectively stacked vertically (e.g., in direction D1) on layer 60-1. As shown in FIG. 15A, the layers 60-2 to 60-N may be stacked horizontally such that the upper surfaces of the layers 60-2 to 60-N are coplanar or substantially coplanar with each other (e.g., coplanar within manufacturing tolerances and/or material tolerances) and/or such that the bottom surfaces of the layers 60-2 to 60-N are coplanar or substantially coplanar with each other.

Figure 15B:
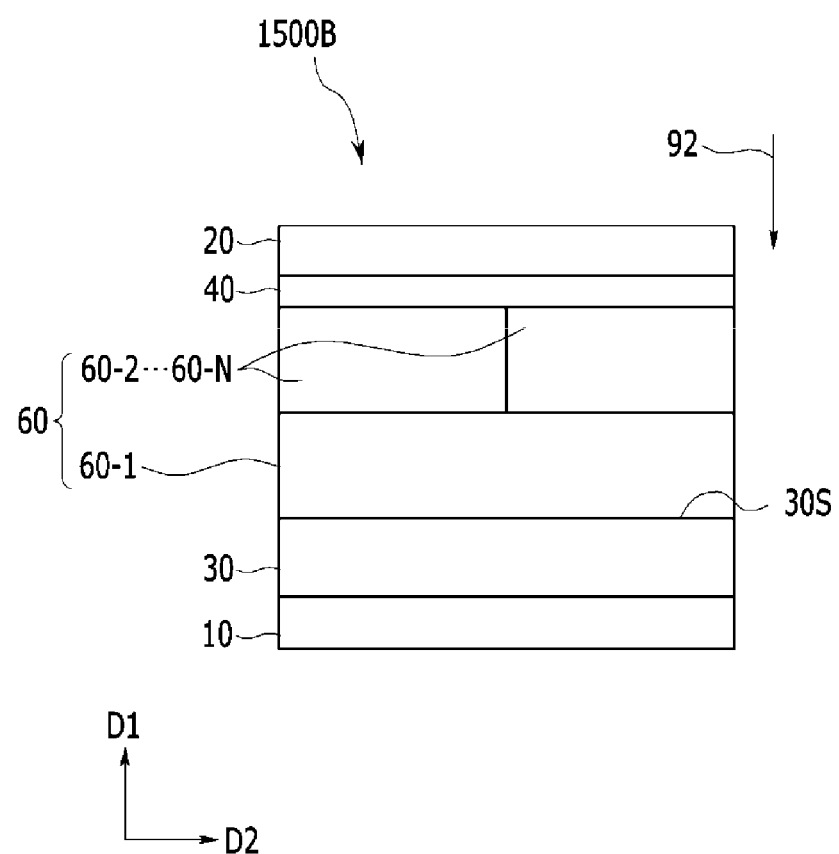

In some example embodiments, including the example embodiments shown in FIGS. 15A-15B, the layers 60-2 to 60-N may be absorption layers that are each configured to absorb one or more different wavelength ray regions of incident light 92 such that the collection of layers 60-2 to 60-N are collectively configured to absorb a collective wavelength ray region of incident light 92 that is different from the wavelength ray region that the layer 60-1 is configured to absorb. For example, in some example embodiments the layers 60-2 to 60-N may be configured to absorb different visible wavelength ray regions (e.g., blue light, green light, red light) of incident light 92 and layer 60-1 may be configured to absorb a UV wavelength ray region of incident light 92.

In some example embodiments, one or more of the absorption layers 60-2 to 60-N may be configured to absorb a wavelength ray region that is different from a visible wavelength ray region (e.g., ultraviolet light and/or infrared light). In some example embodiments, one or more of the absorption layers 60-2 to 60-N may be configured to absorb a visible wavelength ray region and one or more of the absorption layers 60-2 to 60-N may be configured to absorb a wavelength ray region that is different from a visible wavelength ray region (e.g., ultraviolet light and/or infrared light). In some example embodiments, two or more of the absorption layers 60-2 to 60-N may be configured to absorb different wavelength ray regions that are different from a visible wavelength ray region (e.g., one layer may be configured to absorb ultraviolet light and another layer may be configured to absorb infrared light).

Referring now to FIG. 15B, the relative positions of layers 60-2 to 60-N and layer 60-1 are transposed in relation to the relative positions thereof as shown in FIG. 15A, such that layer 60-1 is proximate to the origin direction of incident light 92 (e.g., the incident light side of the organic image sensor 1500B) in relation to layers 60-2 to 60-N. In some example embodiments, the origin direction of incident light 92 may be reversed in relation to what is shown in FIGS. 15A-15C, such that the infrared absorption and hole transport composite monolayer 30 is proximate to the incident light side of the organic image sensor 1500B, 1500A, 1500C in relation to the absorption layer 60, but example embodiments are not limited thereto.

Figure 15C:
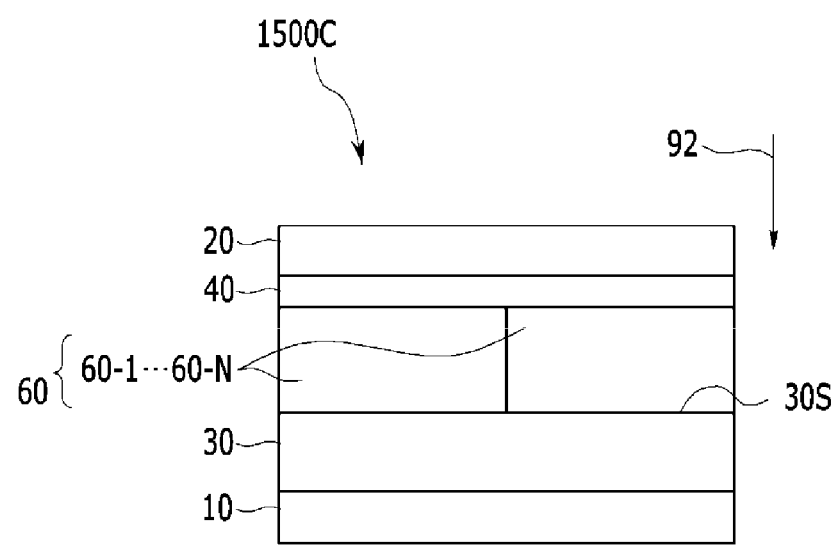
Figure 15C:
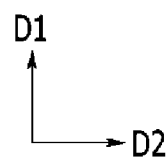

Referring now to FIG. 15C, in some example embodiments the absorption layer 60 may include solely ("only") a horizontal stack (e.g., a stack in the D2 direction) of layers 60-1 to 60-N. Different layers 60-1 to 60-N may be configured to absorb different wavelength ray regions of incident light 92. Such different wavelength ray regions may include one or more visible wavelength ray regions, one or more infrared wavelength ray regions, and one or more ultraviolet wavelength ray regions. As shown in FIG. 15C, the layers 60-1 to 60-N may be stacked horizontally such that the upper surfaces of the layers 60-1 to 60-N are coplanar or substantially coplanar with each other (e.g., coplanar within manufacturing tolerances and/or material tolerances) and/or such that the bottom surfaces of the layers 60-1 to 60-N are coplanar or substantially coplanar with each other.

Figure 15D:
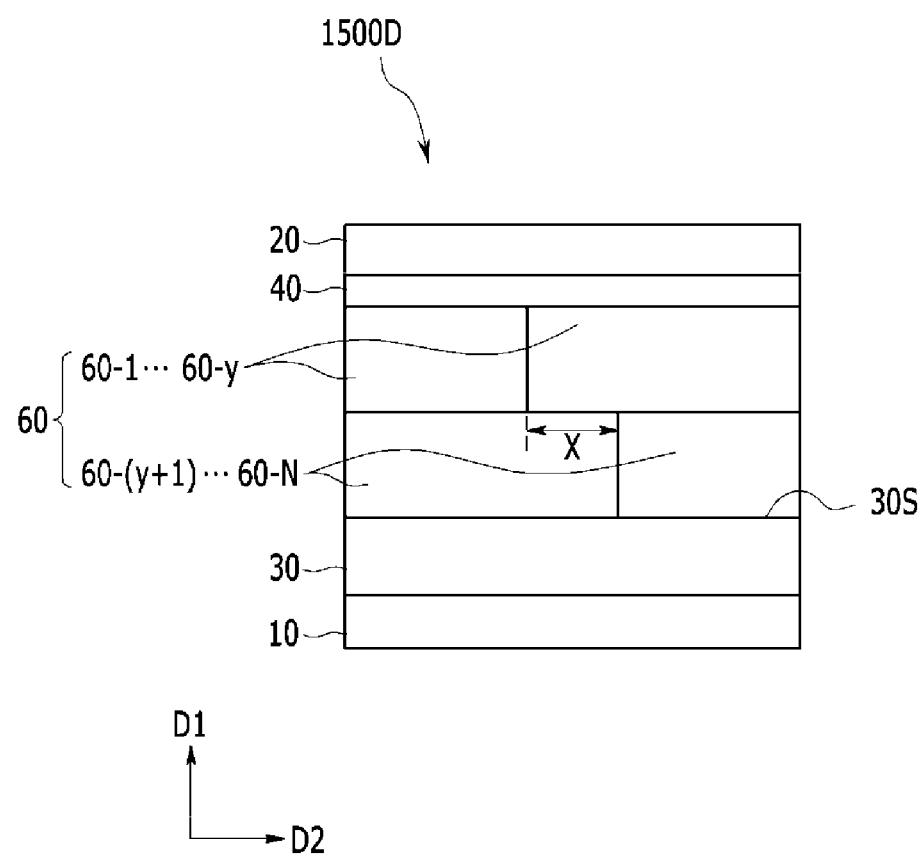

Referring now to FIG. 15D, the absorption layer 60 may include two or more vertically stacked sets of absorption layers 60-1 to 60-N(e.g., stacked in direction D1), where each set of absorption layers 60-1 to 60-Y and 60-(Y+1) to 60-N (Y being a positive integer) includes multiple layers that are horizontally stacked (e.g., stacked in direction D2) in relation to each other. As further shown, an interface between horizontally adjacent layers in one set of layers 60-1 to 60-Y may be horizontally offset from an interface between horizontally-adjacent layers of a vertically-adjacent set of layers 60-(Y+1) to 60-N by an offset distance "x". In some example embodiments, the offset distance x is a null value, such that the interface between horizontally-adjacent layers in one set of layers 60-1 to 60-Y is aligned in the vertical direction (direction D1) with the interface between horizontally-adjacent layers of a vertically-adjacent set of layers 60-(Y+1) to 60-N. In some example embodiments, the offset distance is a real value.

Figure 16:
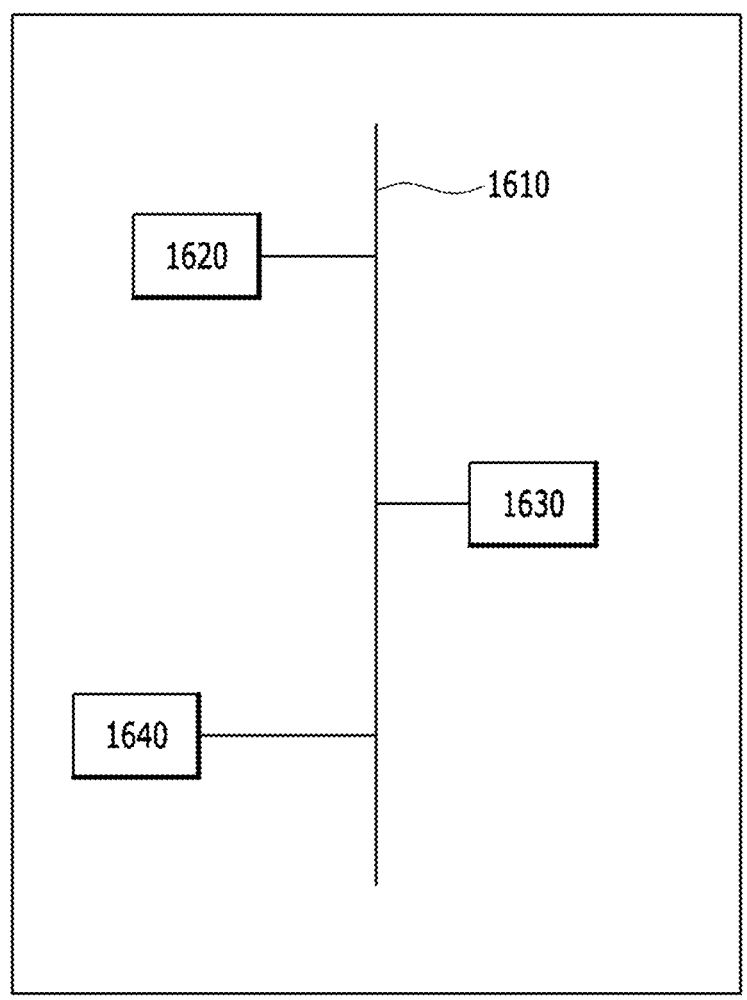
FIG. 16 is a schematic diagram of an electronic device 1600 according to some example embodiments.

FIG. 16 is a schematic diagram of an electronic device 1600 according to some example embodiments.

As shown in FIG. 16, an electronic device 1600 may include a processor 1620, a memory 1630, and an image sensor 1640 that are electrically coupled together via a bus 1610. The image sensor 1640 may be an organic image sensor of any of the example embodiments as described herein. The memory 1630, which may be a non-transitory computer readable medium, may store a program of instructions. The processor 1620 may execute the stored program of instructions to perform one or more functions. For example, the processor 1620 may be configured to process electric signals generated by the image sensor 1640. The processor 1620 may be configured to generate an output (e.g., an image to be displayed on a display interface) based on processing the electric signals.

While this disclosure has been described in connection with what is presently considered to be practical example embodiments, it is to be understood that the inventive concepts are not limited to the disclosed embodiments, but, on the contrary, re intended to cover various modifications and equivalent arrangements included within the spirit and scope of the appended claims.

DESCRIPTION OF SYMBOLS

10: first electrode
20: second electrode
30: infrared absorption and hole transport composite monolayer
40: electron transport layer
50: visible absorption layer

What is claimed is:

1. An infra-red (IR) organic photoelectric device, comprising:
   an anode and a cathode facing each other; and
   an infrared absorption and hole transport composite monolayer between the anode and the cathode,
   wherein the infrared absorption and hole transport composite monolayer includes a hole transport material and a metal oxide, the metal oxide having a work function of greater than about 5.6 eV,
   wherein the hole transport material is
   4,4',4"-tris(N-(2-naphthyl)-N-phenyl-amino)-triphenylamine,
   N,N-diphenyl-N,N-bis(9-phenyl-9H-carbazole-3-yl) biphenyl-4,4'-diamine,
   N(diphenyl-4-yl)9,9-dimethyl-N-(4(9-phenyl-9H-carbazole-3-yl)phenyl)-9H-fluorene-2-amine), or
   di-[4-(N,N-di-p-tolyl-amino)-phenyl]cyclohexane.

2. The IR organic photoelectric device of claim 1, wherein the hole transport material is a material having a highest occupied molecular orbital (HOMO) level that is between a work function of the anode and the work function of the metal oxide.

3. The IR organic photoelectric device of claim 2, wherein a difference between the HOMO level of the hole transport material and the work function of the metal oxide ranges from about 0.01 eV to about 0.89 eV.

4. The IR organic photoelectric device of claim 2, wherein the HOMO level of the hole transport material is greater than about 4.7 eV and less than or equal to about 5.6 eV.

5. The IR organic photoelectric device of claim 2, wherein the hole transport material is a material configured to transmit visible light based on the hole transport material having an energy bandgap of about 2.8 eV to about 4.0 eV.

6. The IR organic photoelectric device of claim 1, wherein the metal oxide is molybdenum oxide or rhenium oxide.

7. The IR organic photoelectric device of claim 2, wherein the infrared absorption and hole transport composite monolayer includes an amount of the metal oxide that occupies a volume of greater than or equal to about 50% of a volume of the infrared absorption and hole transport composite monolayer.

8. The IR organic photoelectric device of claim 1, further comprising:
   an electron transport layer between the cathode and the infrared absorption and hole transport composite monolayer.

9. An organic image sensor, comprising:
   an anode and a cathode facing each other;

an absorption layer between the anode and the cathode, the absorption layer being a visible absorption layer or an ultraviolet (UV) absorption layer; and an infrared absorption and hole transport composite monolayer between the anode and the absorption layer, wherein the infrared absorption and hole transport composite monolayer includes a hole transport material and a metal oxide, the metal oxide having a work function of greater than about 5.6 eV, wherein the hole transport material is
- 4,4',4''-tris(N-(2-naphthyl)-N-phenyl-amino)-triphenylamine,
- N,N-diphenyl-N,N-bis(9-phenyl-9H-carbazole-3-yl)biphenyl-4,4'-diamine,
- N(diphenyl-4-yl)9,9-dimethyl-N-(4(9-phenyl-9H-carbazole-3-yl)phenyl)-9H-fluorene-2-amine), or
- di-[4-(N,N-di-p-tolyl-amino)-phenyl]cyclohexane.

10. The organic image sensor of claim 9, wherein the hole transport material is a material having a highest occupied molecular orbital (HOMO) level that is between a work function of the anode and the work function of the metal oxide.

11. The organic image sensor of claim 10, wherein a difference between the HOMO level of the hole transport material and the work function of the metal oxide ranges from about 0.01 eV to about 0.89 eV.

12. The organic image sensor of claim 10, wherein the HOMO level of the hole transport material is greater than about 4.7 eV and less than or equal to about 5.6 eV.

13. The organic image sensor of claim 10, wherein the hole transport material is a material configured to transmit visible light based on the hole transport material having an energy bandgap of about 2.8 eV to about 4.0 eV.

14. The organic image sensor of claim 9, wherein the metal oxide is molybdenum oxide or rhenium oxide.

15. The organic image sensor of claim 10, wherein the infrared absorption and hole transport composite monolayer includes an amount of the metal oxide that occupies a volume of greater than or equal to about 50% of a volume of the infrared absorption and hole transport composite monolayer.

16. The organic image sensor of claim 9, further comprising:
an electron transport layer between the cathode and the absorption layer.

17. The organic image sensor of claim 9, wherein the absorption layer is the visible absorption layer.

18. The organic image sensor of claim 9, wherein the absorption layer is the UV absorption layer.

* * * * *